(12) United States Patent
Hong

(10) Patent No.: US 6,375,810 B2
(45) Date of Patent: *Apr. 23, 2002

(54) PLASMA VAPOR DEPOSITION WITH COIL SPUTTERING

(75) Inventor: Liubo Hong, San Jose, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 62 days.

This patent is subject to a terminal disclaimer.

(21) Appl. No.: 08/971,867

(22) Filed: Nov. 19, 1997

Related U.S. Application Data

(63) Continuation-in-part of application No. 08/907,382, filed on Aug. 7, 1997, now abandoned.

(51) Int. Cl.[7] .............................................. C23C 14/34
(52) U.S. Cl. ........................... 204/192.12; 204/192.13; 204/192.15; 204/298.03; 204/298.06; 204/298.07; 204/298.08; 204/298.12
(58) Field of Search ...................... 204/298.06, 298.07, 204/298.08, 298.11, 298.12, 298.13, 298.15, 298.16, 298.03, 192.12, 192.13, 192.15, 192.32, 192.33, 192.35, 192.1; 156/345; 118/723 I, 723 IR

(56) References Cited

U.S. PATENT DOCUMENTS

| | | |
|---|---|---|
| 3,594,295 A | 7/1971 | Meckel et al. ......... 204/298.06 |
| 3,675,093 A | 7/1972 | Russo et al. ................ 361/296 |
| 4,284,490 A | 8/1981 | Weber ................... 204/298.08 |

(List continued on next page.)

FOREIGN PATENT DOCUMENTS

| | | |
|---|---|---|
| EP | 0520519 | 12/1992 |
| EP | 0607797 | 1/1994 |
| EP | 0774886 | 5/1997 |

(List continued on next page.)

OTHER PUBLICATIONS

Search Report in PCT application Serial No. PCT/US98/16317, filed Aug. 6, 1998.*

(List continued on next page.)

Primary Examiner—Rodney McDonald
(74) Attorney, Agent, or Firm—Konrad Raynes & Victor

(57) ABSTRACT

A method and apparatus for depositing a layer of a material which contains a metal on a workpiece surface, in an installation including a deposition chamber; a workpiece support providing a workpiece support surface within the chamber; a coil within the chamber, the coil containing the metal that will be contained in the layer to be deposited; and an RF power supply connected to deliver RF power to the coil in order to generate a plasma within the chamber, a DC self bias potential being induced in the coil when only RF power is delivered to the coil. A DC bias potential which is different in magnitude from the DC self bias potential is applied to the coil from a DC voltage source.

In order to place a deposition chamber of a physical vapor deposition apparatus in which metal or other material is sputtered from a target and a coil in condition to effect deposition of a layer consisting of the sputtered material on a substrate subsequent to deposition, in the apparatus, of a layer containing a reaction compound of the sputtered material, the chamber is filled with a nonreactive gas and a voltage is applied to sputter from the target and coil any reaction compound which has coated the target and coil during deposition of the layer containing the reaction compound of the sputtered metal.

38 Claims, 2 Drawing Sheets

U.S. PATENT DOCUMENTS

| | | | |
|---|---|---|---|
| 4,336,118 A | 6/1982 | Patten et al. | 204/192.12 |
| 4,362,632 A | 12/1982 | Jacob | 422/186.04 |
| 4,441,092 A | 4/1984 | Thornton et al. | 336/130 |
| 4,626,312 A | 12/1986 | Tracy | 156/345 |
| 4,661,228 A | 4/1987 | Mintz | 204/192.25 |
| 4,716,491 A | 12/1987 | Ohno et al. | 361/230 |
| 4,792,732 A | 12/1988 | O'Loughlin | 315/334 |
| 4,842,703 A | 6/1989 | Class et al. | 204/192.12 |
| 4,844,775 A | 7/1989 | Keeble | 216/68 |
| 4,865,712 A | 9/1989 | Mintz | 204/298.16 |
| 4,871,421 A | 10/1989 | Ogle et al. | 438/710 |
| 4,918,031 A | 4/1990 | Flamm et al. | 438/695 |
| 4,925,542 A | 5/1990 | Kidd | 427/531 |
| 4,941,915 A | 7/1990 | Matsuoka et al. | 204/298.12 |
| 4,948,458 A * | 8/1990 | Ogle | 438/729 |
| 4,990,229 A | 2/1991 | Campbell et al. | 204/298.06 |
| 4,999,096 A | 3/1991 | Nihei et al. | 204/192.3 |
| 5,065,698 A | 11/1991 | Koike | 118/719 |
| 5,091,049 A | 2/1992 | Campbell et al. | 216/37 |
| 5,108,569 A * | 4/1992 | Gilboa et al. | 204/192.13 |
| 5,122,251 A | 6/1992 | Campbell et al. | 204/298.06 |
| 5,135,629 A | 8/1992 | Sawada et al. | 204/192.12 |
| 5,146,137 A | 9/1992 | Gesche et al. | 315/111.21 |
| 5,175,608 A | 12/1992 | Nihei et al. | 257/751 |
| 5,178,739 A * | 1/1993 | Barnes et al. | 204/192.12 |
| 5,195,045 A | 3/1993 | Keane et al. | 702/107 |
| 5,206,516 A | 4/1993 | Keller et al. | 250/492.2 |
| 5,225,740 A | 7/1993 | Ohkawa | 315/111.41 |
| 5,231,334 A | 7/1993 | Paranjpe | 315/111.21 |
| 5,234,560 A | 8/1993 | Kadlec et al. | 204/192.12 |
| 5,240,880 A * | 8/1993 | Hindman et al. | 204/192.17 |
| 5,241,245 A | 8/1993 | Barnes et al. | 315/111.41 |
| 5,280,154 A | 1/1994 | Cuomo et al. | 219/121.52 |
| 5,292,393 A | 3/1994 | Maydan et al. | 156/345 |
| 5,304,279 A | 4/1994 | Coultas et al. | 156/345 |
| 5,312,717 A | 5/1994 | Sachdev et al. | 430/313 |
| 5,346,578 A | 9/1994 | Benzing et al. | 156/345 |
| 5,361,016 A | 11/1994 | Ohkawa et al. | 315/111.41 |
| 5,366,590 A | 11/1994 | Kadomura | 438/723 |
| 5,368,685 A | 11/1994 | Kumihashi et al. | 216/70 |
| 5,392,018 A | 2/1995 | Collins et al. | 336/155 |
| 5,397,962 A | 3/1995 | Moslehi | 315/111.51 |
| 5,401,350 A | 3/1995 | Patrick et al. | 156/345 |
| 5,404,079 A | 4/1995 | Ohkuni et al. | 315/111.81 |
| 5,418,431 A | 5/1995 | Williamson et al. | 315/111.51 |
| 5,421,891 A | 6/1995 | Campbell et al. | 118/723 R |
| 5,424,691 A | 6/1995 | Sadinsky | 333/17.3 |
| 5,427,666 A * | 6/1995 | Mueller et al. | 204/192.17 |
| 5,429,070 A | 7/1995 | Campbell et al. | 118/723 R |
| 5,429,710 A | 7/1995 | Akiba et al. | 438/714 |
| 5,429,995 A | 7/1995 | Nishiyama et al. | 118/723 R |
| 5,430,355 A | 7/1995 | Paranjpe | 315/111.21 |
| 5,503,676 A | 4/1996 | Shufflebotham et al. | 118/723 MR |
| 5,573,595 A | 11/1996 | Dible | 118/723 MP |
| 5,585,766 A | 12/1996 | Shel | 333/17.3 |
| 5,689,215 A | 11/1997 | Richardson et al. | 333/17.3 |
| 5,759,280 A | 6/1998 | Holland et al. | 118/723 I |
| 6,042,700 A * | 3/2000 | Gopalraja et al. | 204/192.15 |

FOREIGN PATENT DOCUMENTS

| | | |
|---|---|---|
| EP | 0791663 | 8/1997 |
| EP | 0836219 | 4/1998 |
| GB | 2162365 | 1/1986 |
| GB | 2231197 | 11/1990 |
| JP | 59-190363 | 10/1984 |
| JP | 61-190070 | 8/1986 |
| JP | 6232055 | 8/1994 |
| JP | 6283470 | 10/1994 |
| JP | 7176398 | 7/1995 |
| JP | 7176399 | 7/1995 |
| JP | 8153712 | 6/1996 |
| JP | 8288259 | 11/1996 |
| WO | WO860623 | 11/1986 |
| WO | 9207969 | 5/1992 |
| WO | 9214258 | 8/1992 |

OTHER PUBLICATIONS

Search Report in PCT application Serial No. PCT/US98/16395.*

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Metal Ion Deposition from Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. B13, pp. 125–129, 1995.

Y–W. Kim et al., "Directed Sputter Deposition of AlCu: Film Microstructure and Chemistry," *J. Vac. Sci. Technol.*, vol. A12, pp. 3169–3175, 1994.

J. Hopwood et al., "Mechanisms for Highly Ionized Magnetron Sputtering," *J. Appl. Phys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

N. Jiwari et al., "Helicon wave plasma reactor employing single–loop antenna," *J. of Vac. Sci. Technol.*, A 12(4), pp. 1322–1327, Jul./Aug. 1994.

Search report dated Feb. 27, 1997, EPC application No. 96308251.6.

U.S. patent application Ser. No. 08/310,617, filed Sep. 30, 1992 (Atty. Dk. 364.P1).

U.S. patent application Ser. No. 08/567,601, filed Jun. 2, 1995 (Atty. Dk. 364.P2).

U.S. patent application Ser. No. 08/733,620, filed Oct. 17, 1996 (Attorny Docket #1457/PVD/DV).

U.S. patent application Ser. No. 08/730,722, filed Oct. 8, 1996 (Aty. Dk. 1207/MD/PVD/DV).

U.S. patent application Ser. No. 08/907,382, filed Aug. 7, 1997 (Aty. Dk. 1957/PVD/DV).

U.S. patent application Ser. No. 08/857,921, filed May 16, 1997 (Aty. Dk. 1737/ND/PVD/DV).

U.S. patent application Ser. No. 08/857,720, filed May 16, 1997 (Aty. Dk. 1800/PVD/DV).

U.S. patent application Ser. No. 08/908,341, filed Aug. 7, 1997 (Aty. Dk. 1873/PVD/DV).
U.S. patent application Ser. No. 08/908,342, filed Sep. 7, 1997 (Aty. Dk. 1620/PVD/DV).
U.S. Ser. No. 08/851,946 (Atty. Dkt. 1390.C1).
U.S. Ser. No. 08/853,024 (Atty. Dkt. 1186.P1).
U.S. Ser. No. 08/856,335 (Atty. Dkt 1736).
U.S. Ser. No. 08/857,719 (Atty. Dkt. 1752).
U.S. Ser. No. 08/857,944 (Atty. Dkt. 1871).
U.S. Ser. No. 09/049,839 (Atty. Dkt. 938.D1).
U.S. patent application Ser. No. 08/851,946 Filed May 6, 1997 (Atty Dkt 1390.C/5491).

* cited by examiner

PLASMA VAPOR DEPOSITION WITH COIL SPUTTERING

CROSS-REFERENCE TO RELATED APPLICATIONS

This is a continuation-in-part of my application Ser. No. 08/907382, filed Aug. 7, 1997, now abandoned entitled PLASMA VAPOR DEPOSITION WITH COIL SPUTTERING.

BACKGROUND OF THE INVENTION

The present invention relates to the deposition of layers, or films, of metals and metal compounds on a workpiece, or substrate, during fabrication of integrated circuits, display components, etc. In connection with the fabrication of integrated circuits, the substrate may be constituted by one or more semiconductor wafers, while in the case of fabrication of a display, such as a liquid crystal display, the substrate may be one or more glass plates. The substrate could also be a hard disc that will be used for data storage, or read/write heads for a disc drive.

It is known to deposit layers on such substrates by processes such as physical vapor deposition. By way of example, as described in copending application Ser. No. 08/680,335, filed Jul. 10, 1996 now abandoned, entitled "Coils for Generating a Plasma and for Sputtering" by Jaim Nulman et al., which is assigned to the assignee of the present application and incorporated herein by reference in its entirety, processes of this type may be performed in apparatus including a deposition chamber which contains a target, a coil and a support for the substrate. The target is made of a material such as a metal which will form a metal layer or the metal component of a metal compound layer. The coil will be supplied with an RF current that will generate, within the chamber, an RF electromagnetic field.

When a gas is introduced into the chamber at an appropriate pressure, a dense plasma ($10^{11}$–$10^{13}$ ions/cm$^3$) may be ignited inside the chamber by the RF electromagnetic field. The target may be associated with a magnetic field producing device, such as a magnetron, and may be biased by a DC or RF voltage applied to the target from a voltage source. The magnetic field traps electrons, while the DC bias voltage on the target attracts ions to the target. These ions dislodge, or sputter, atoms or clusters of atoms of material from the target. The sputtered atoms travel toward the support and a certain proportion of these atoms are ionized in the plasma. The support provides a surface for supporting the substrate and may be biased, usually by an AC source, to bias the substrate with a polarity selected to attract ionized target material to the substrate surface. The bottom coverage of high aspect ratio trenches and holes on the substrate can be improved by this substrate bias. Alternatively, the chamber may sputter target material without an RF coil or other devices for generating an ionizing plasma such that substantially all the material deposited is not ionized.

Although the RF electromagnetic field is generated by applying an alternating RF current to the coil, a DC potential may be induced in the coil as described in the aforementioned copending application Ser. No. 08/680,335. This potential which may be referred to as a self bias, combines with the RF potential on the coil. The combined DC and RF potentials have the net effect of attracting ions from the plasma to the coil. If the coil is made of the same material as the target, the coil can constitute an additional source of deposition material which will be sputtered from the coil by ions attracted from the plasma to be deposited on the substrate.

If a film consisting essentially of only the sputtered material is to be formed on a substrate, then the gas within the chamber is preferably nonreactive with respect to the sputtered atoms. If, on the other hand, a compound film formed by a chemical reaction of the target material with another constituent is to be formed, the gas introduced into the chamber may have a composition selected to react with the sputtered target material ions and atoms to form molecules of the compound, which are then deposited on the substrate. Alternatively, the gas may react with the target material while or after it is deposited.

For example, plasma and nonionizing plasma sputtering deposition processes of the type described above can be used to deposit either a pure metal or metal alloy, such as titanium, tantalum, aluminum, copper, aluminum-copper, etc., or a metal compound, such as titanium nitride (TiN), aluminum oxide ($Al_2O_3$), etc. Also, other non metallic materials may be deposited such as silicon and silicon dioxide. For deposition of a pure metal or metal alloy, the target, and possibly the coil, will be made of this metal and the plasma gas is preferably a non-reactive gas, i.e. a gas such as argon, helium, xenon, etc., which will not react with the metal. For deposition of a metal compound, the target, and possibly the coil, will be made of one component of the compound, typically the metal or metal alloy, and the chamber gas will include a reactive gas composed of, or containing, the other component or components of the compound, such as nitrogen or oxygen. The sputtered metal reacts with gas atoms or molecules to form the compound, molecules of which are then deposited on the substrate. In the same manner, a nonmetallic target material may be sputtered in a nonreactive environment to deposit relatively pure target material onto the substrate. Alternatively, the target material may be sputtered in a reactive environment to produce on the substrate a layer of a compound of the target material and a reactive component. Hereinafter, a compound formed of a target or coil material and a reactive component will be referred to as a reaction compound, whether the sputtered material is metallic or otherwise.

One factor determining the performance of such apparatus is the density of gas, and hence the density of the plasma, in the chamber. A relatively dense plasma can provide an increased ionization rate of the sputtered material atoms, thus improving bottom coverage of trenches and holes on the substrate. However, under high pressure conditions, material sputtered from the target tends to be deposited preferentially in a central region of the substrate support surface. Such nonuniformity can often increase at higher deposition rates or higher pressures.

This nonuniformity is disadvantageous because the thickness of the deposited layer preferably should correspond to a nominal value, within a narrow tolerance range, across the entire support surface. Therefore, when the substrate is, for example, a wafer which will ultimately be diced into a plurality of chips, and there is a substantial variation in the thickness of the layer across the wafer surface, many of the chips may become rejects that must be discarded.

As described in the aforementioned copending application Ser. No. 08/680,335, it has been recognized that material sputtered from the coil may be used to supplement the deposition material sputtered from the primary target of the chamber. Because the coil can be positioned so that material sputtered from the coil tends to deposit more thickly at the periphery of the wafer, the center thick tendency for material sputtered from the primary target can be compensated by the edge thick tendency for material sputtered from the coil. As a result, uniformity can be improved.

The quantities of material sputtered from the coil and the target are a function of several factors including the DC power applied to the target and the RF power applied to the coil. However, the freedom to adjust these and other factors may be limited in some applications by the requirements of other process parameters which are often interdependent. Thus, a need exists for further control over the quantity of material sputtered from the coil to facilitate further increases in the degree of uniformity of deposition that may be achieved.

In addition, when such apparatus is used to deposit a reaction compound layer, some of the reaction compound typically also coats the target and the coil. For example, when titanium nitride is deposited in a chamber having a titanium metal target in a nitrogen atmosphere, titanium nitride typically coats the target and coil. Therefore, if it were then attempted to deposit a pure target material layer, i.e., a layer of just titanium, in the same apparatus, the reaction compound molecules of titanium nitride would likely also be sputtered from the target, and also from the coil, and thus could contaminate the titanium metal layer. Therefore, it has generally not been practical to sputter deposit a metal or metal alloy layer from a target of the same material immediately after having deposited a metal compound layer in the same apparatus.

Some efforts have been made to deal with this drawback by sputtering away the metal compound layer coating on the target, and covering over the metal compound layer coating on the coil with a layer of the metal sputtered from the target, this procedure being known as "pasting". However, such attempts have generally been found to be unacceptably costly and time-consuming, and otherwise unsatisfactory.

Therefore, facilities in which layers of a metal and layers of a compound of that metal are to be deposited on substrates are typically equipped with two apparatuses, each for depositing a respective type of layer. This, of course, may entail twice the investment cost associated with one apparatus. Moreover, in production systems having multiple chambers coupled to a central transfer chamber, valuable perimeter space of the transfer chamber is occupied by an extra chamber that could otherwise be used by another chamber to increase throughput or provide additional processes.

BRIEF SUMMARY OF THE INVENTION

It is an object of the present invention to alleviate the above difficulties.

A more specific object of the invention is to improve the uniformity with which a layer of material is deposited on a substrate.

Another object of the invention is to achieve such improvement in uniformity without any significant increase in the cost or complexity of the deposition apparatus.

Still another object of the invention is to improve deposited film uniformity while, at the same time, improving apparatus throughput.

Still another object of the invention is to improve deposited film uniformity while at the same time reducing the cost and complexity of the deposition apparatus.

Still another object of the invention is to allow added control of the rate of deposition of material on a substrate.

A further specific object of the invention is to facilitate deposition of a layer of a target material such as an elemental metal or metal alloy in a single deposition apparatus a short time after completion of deposition of a layer of a reaction compound of the target material and another constituent.

A still more specific object of the invention is to rapidly remove reaction compound material which has been deposited on the target or coil in a deposition chamber subsequent to a reaction compound layer deposition process and prior to a target material layer deposition process which does not include a reactive constituent.

The above and other objects are achieved, according to the present invention, by a method and apparatus for sputter depositing a layer on a substrate in which following deposition of a layer of reaction compound formed from constituents which includes a reactive material and a material sputtered from a target or coil, a layer of material sputtered from the same target or coil may be deposited in the same chamber in which the subsequent layer is substantially free of contamination by the reaction compound or the reactive material. In the illustrated embodiment, this may be achieved by removing the reactive material from the sputter chamber following the deposition of the reaction compound, introducing a non-reactive gas into the enclosure; and sputtering substantially all reaction compound from the target or coil which provided the source of the sputtered material. As a consequence, the same chamber is then ready to deposit another layer except that the layer may be a layer consisting essentially of only material sputtered from the source. In this manner, a chamber may be used to deposit a metal compound such as titanium nitride and then after sputter cleaning, be ready to deposit a layer of relatively pure titanium in the same chamber without substantial contamination by titanium nitride.

This aspect of the invention is particularly applicable to apparatus which includes a chamber containing a sputtering target and a plasma generating coil. According to the invention, a suitable voltage is applied to the coil, while the chamber is filled with a non-reactive gas and does not contain any substrate, to produce a plasma which will rapidly sputter deposited metal compound material from the target, and possibly also from the coil.

The above and other objects are further achieved, according to the present invention, by a method and an apparatus for depositing a layer of a material which contains a metal on a workpiece surface in which both RF energy is supplied to a coil to generate a plasma to ionize the deposition material, and a separate DC bias is applied to the coil to control the coil sputtering rate. In the illustrated embodiment, a DC voltage source is coupled to the coil through an RF filter to provide a DC bias potential which is different in magnitude from the coil DC self bias potential which results from the applied RF power. In this manner, the coil bias potential and hence the coil sputtering rate may be controlled with a degree of independence from the RF power applied to the coil.

In another aspect of the invention, the coil may be shaped and positioned to permit use as the sole source of sputtered material within said chamber while maintaining good uniformity. As a consequence, in some applications, the need for a separate target and associated magnetron may be eliminated.

DETAILED DESCRIPTION OF EMBODIMENTS

Figure 1:
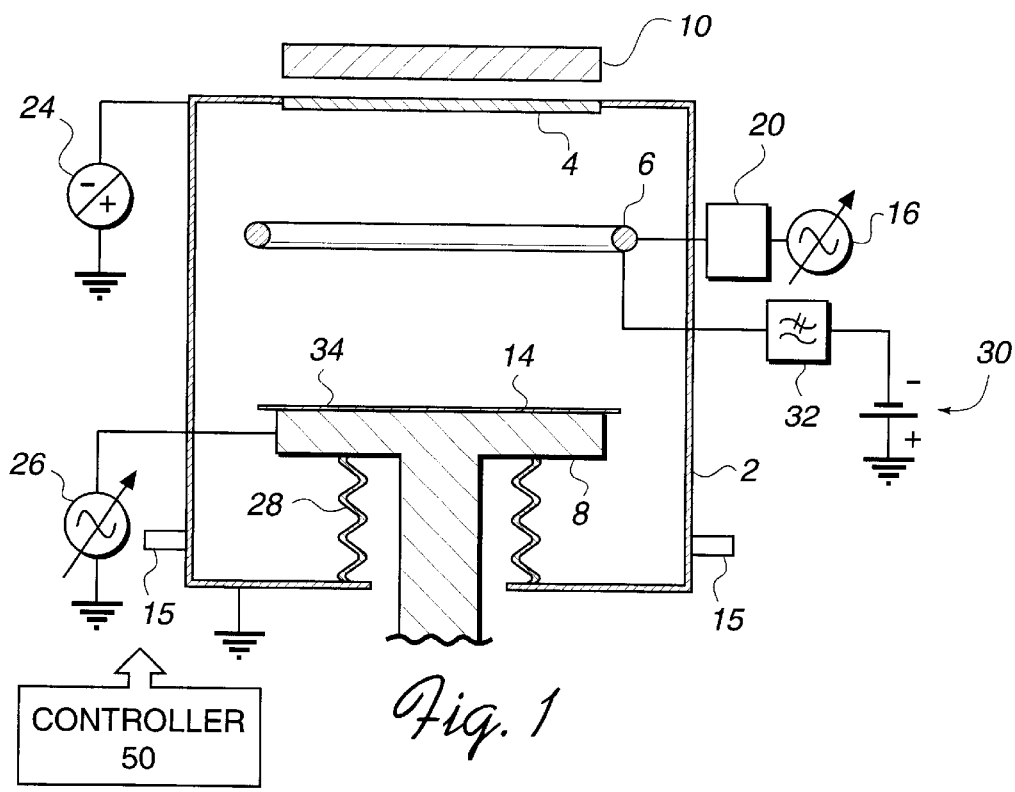
FIG. 1 is a simplified, elevational, cross-sectional view of deposition apparatus constructed according to one embodiment of the invention.

FIG. 1 shows the basic components of one embodiment of a deposition apparatus constructed according to a first preferred embodiment of the invention.

The illustrated apparatus includes a deposition chamber 2, a sputtering target 4, a plasma generating coil 6 and a workpiece support 8, all of which are disposed within chamber 2. Outside of chamber 2, and above target 4, there is provided a magnetic field generating assembly, such as a magnetron, 10. Target 4 is made of a conductive material, for example a metal, such as titanium, which is to be sputtered and then deposited on a workpiece provided on a workpiece support surface 14 of workpiece support 8. Other materials which are currently deposited in such apparatus include metals and alloys such as aluminum, copper, tantalum, aluminum-copper alloys and metal compounds such as titanium nitride and tantalum nitride.

Figure 2:
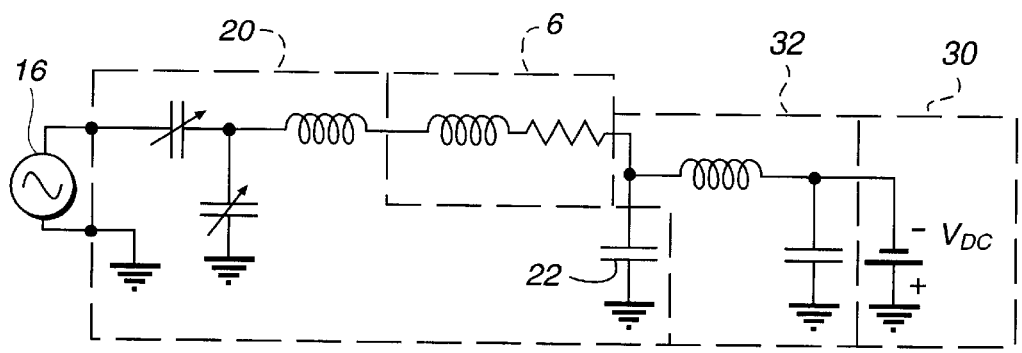
FIG. 2 is a circuit diagram illustrating electrical systems associated with the apparatus of FIG. 1.

In order to make possible the generation of a plasma within chamber 2, a suitable quantity of an ionizable gas, such as argon, is introduced into the chamber through a port 15 and RF power is supplied to coil 6 from an RF power supply 16 via an appropriate matching network 20. One end of coil 6 is connected to matching network 20 and the other end of coil 6 is connected to ground via a DC blocking capacitor 22 (FIG. 2). The RF power supplied to coil 6 results in the generation of an electromagnetic field that produces a plasma. Assembly 10 also contributes to generation of a plasma within chamber 2. In the absence of RF current in coil 6, a plasma of lower density can also be generated in the vicinity of target 4 and magnetron 10 by applying a DC or RF voltage to target 4.

Under these conditions, a material to be deposited on a substrate disposed on surface 14 will be sputtered from target 4, at least partially ionized in the plasma field and directed to the workpiece.

The sputtering of material from target 4 is aided by biasing target 4, by means of a biasing voltage source 24, such as a DC source, with a polarity to attract ions in the plasma. The attracted ions impact on target 4 and dislodge atoms or clusters of atoms of the material making up target 4.

A proportion of the atoms sputtered from target 4 will be ionized in the plasma to become, in the case of a metal, positive ions. In order to promote deposition of these positive ions on the workpiece surface, workpiece support 8 is connected to a suitable bias voltage source 26 such as an AC source. In the illustrated embodiment, sources 24 and 26 cause a negative bias to develop on the target 6 and the substrate 14, respectively.

Since it is often desired to be able to move workpiece support 8 vertically within chamber 2, while the interior of chamber remains sealed, workpiece support 8 may be coupled to chamber 2 by an appropriate bellows 28.

When the only voltage applied to coil 6 is an alternating RF voltage, it is believed that a DC self bias is inherently induced on coil 6 across blocking capacitor 22. In the illustrated embodiment, this bias will have a negative polarity and can be of the order of −100 volts. If coil 6 is made of a sputterable material, then ions in the plasma will be attracted to coil 6 as a result of the DC self bias and these ions will sputter, or dislodge, atoms or clusters of atoms of material from the surface of coil 6. Therefore, by making coil 6 of the same material as target 4, the rate of generation of material for deposition on the workpiece surface can be increased. Still further, the target and coil 6 provide spatially separated sources of sputter material, which can be used to improve film properties.

Since coils, such as coil 6, may be dimensioned and positioned so as to be outside the periphery of workpiece support surface 14, it has been found that sputtered material originating from coil 6 will tend to be deposited thicker in the peripheral region of the workpiece support surface than in the center region. This is beneficial because in many installations, and particularly those operating with high pressures, material sputtered from target 4 tends to be deposited thicker in the central region of the workpiece support surface than in the peripheral region. Thus, the sputtering of deposition material from coil 6 can help to counteract the tendency of material sputtered from target 4 to be deposited to a greater thickness in the central region of the workpiece support surface.

To obtain the best deposition uniformity, the coil sputtering rate is preferably sufficiently high relative to the target sputtering rate to compensate for any deposition nonuniformity of material from the target. One way this might be achieved is to reduce the target sputtering rate. But a lower target sputtering rate usually results in a lower deposition rate on the substrate, and therefore a lower system throughput. Another approach is to increase the coil sputtering rate by increasing RF power level. However, the optimum value of the RF power applied to the coil is a function of several process parameters and chamber design considerations. Hence, in many applications a particular RF power level which may provide a useful self bias on the coil 6 to provide a desired coil sputtering rate, may have a disadvantageous effect on these other factors or may be higher than that which may be provided by the particular system. Thus, the RF power level which provides the best uniformity of deposition may not be appropriate for the particular chamber or may adversely affect other film properties.

In accordance with one aspect of the invention, the coil sputtering rate may be controlled with a degree of independence of the RF power level. In the illustrated embodiment, not only is RF energy supplied to the coil to generate a plasma to ionize the deposition material, but a separate DC bias is also applied to the coil to separately control the coil bias level and hence control the coil sputtering rate. As a result, one need not be limited to the DC self bias which is created when only an alternating RF current is applied to the coil.

Thus, according to the invention, the DC bias on coil 6 is altered, independently of the magnitude and frequency of the RF power delivered by supply 16, by also connecting coil 6 to a DC voltage source 30. Preferably, an RF blocking filter 32 is connected between coil 6 and DC voltage source 30. Such an RF blocking filter, when designed properly, can eliminate or reduce substantially RF current flowing to the DC source 30. Filter 32 provides a negligibly small DC impedance between source 30 and coil 6 so that coil 6 will be placed at a DC bias essentially equal to the voltage provided by voltage source 30. While voltage source 30 is represented schematically by a battery, it will be appreciated that any suitable DC voltage source can be employed and the output voltage thereof can be adjusted to produce the desired level of DC bias on coil 6.

While the RF generator 16 and matching network 20 are preferably coupled to one end of the coil 6, the DC source 30 and RF filter 32 may be coupled to the coil anywhere along its length. For example, as shown in FIG. 2, the DC source 30 and filter 32 may be coupled to end of coil 6 to which is the end to which the blocking capacitor 22 is coupled which is opposite to the end to which RF generator 16 is coupled.

As an alternative to the arrangement illustrated in FIG. 1, it will be appreciated that a separate voltage source 30 need not be provided and RF filter 32 could, instead, be connected between coil 6 and the DC voltage source 24. Since there is no DC path from coil 6 to ground, the current flow between voltage source 30 and coil 6 will be a function primarily of the sputtering current as ions impact the coil 6 and secondary electrons are emitted into the plasma. Therefore, voltage source 30, or voltage source 24, if used in place of source 30, preferably should be capable of producing a sufficiently high output current to accommodate the anticipated sputtering rate.

FIG. 2 is a circuit diagram illustrating one example of circuitry employed for supplying RF current and a DC bias voltage to coil 6. Here coil 6 is represented by its equivalent circuit, which is a series arrangement of an inductance and a resistance.

Matching network 20 is a conventional network which includes two adjustable capacitors and an inductor. As is known, the purpose of circuit 20 is to match the output impedance of RF power supply 16 to the impedance of the load to which it is connected. In addition, the DC blocking capacitor 22 connected between coil 6 and ground serves to prevent flow of a DC current from coil 6 to ground. To improve deposited layer uniformity, RF frequency and power levels may be periodically altered during deposition. In addition, impedances of the components of the matching network and blocking capacitor may be periodically varied during deposition.

Filter 32 is constructed, in a conventional manner, of impedances such as capacitors and inductors, to block transmission of RF power from coil 6 to voltage source 30.

In the embodiment shown in FIG. 1, if it is desired to reduce the rate at which metal is sputtered from target 4 in order to improve the deposited layer thickness uniformity across the substrate surface, this can be achieved by reducing the DC power applied to target 4.

Since plasma generating coil 6 can be converted into an effective source of sputtered material by application thereto of a suitable DC bias potential, then, according to a further feature of the present invention, the possibility exists of completely eliminating target 4 and its associated assembly 10 and using the coil as the sole source of sputtering material.

However, if the coil is to be used as the only sputtering material source, then it would be desirable to configure the coil to produce sputtered material in such a manner that the resulting layer deposited on the workpiece will have a substantially uniform thickness across the workpiece surface area. For example, coil 6 could be replaced by a flat multi-turn coil, as represented by coil 36 in FIG. 3. Apart from the different configuration of the coil and the elimination of target 4, assembly 10 and voltage supply 24, the apparatus shown in FIG. 3 may be identical to that shown in FIG. 1 and described above.

It is believed that the rate of production of sputtered material can be readily controlled by adjusting the level of voltage produced by source 30. Thus, source 30 is preferably an adjustable voltage source.

When target 4 is no longer needed as a sputtered material source, the system designer has greater freedom to select the configuration of the plasma generating coil. Heretofore, it was considered preferable to construct the coil in such a manner as to not obstruct the movement of sputtered material from the target 4 to the workpiece. When target 4 is no longer provided, this limitation no longer exists. In addition, when a target is no longer present, one has greater freedom to select the height of the coil above workpiece support surface 14. Depending on the shape of processing chamber 2 and the configuration of the plasma generating coil, it may be found to be preferable to move the coil either up or down relative to the height which the coil would have in that chamber when a separate target 4 is also provided. However, as a general rule, displacing the coil upwardly may result in ionization of a higher percentage of the sputtered material prior to reaching the substrate surface and thus could increase the percentage of the deposited material reaching the bottoms of grooves in the substrate. Furthermore, elimination of target 4 and magnetic field generating assembly 10 could represent a substantial simplification of the design of the apparatus and provide a corresponding reduction in the cost of manufacturing the apparatus.

Figure 3:
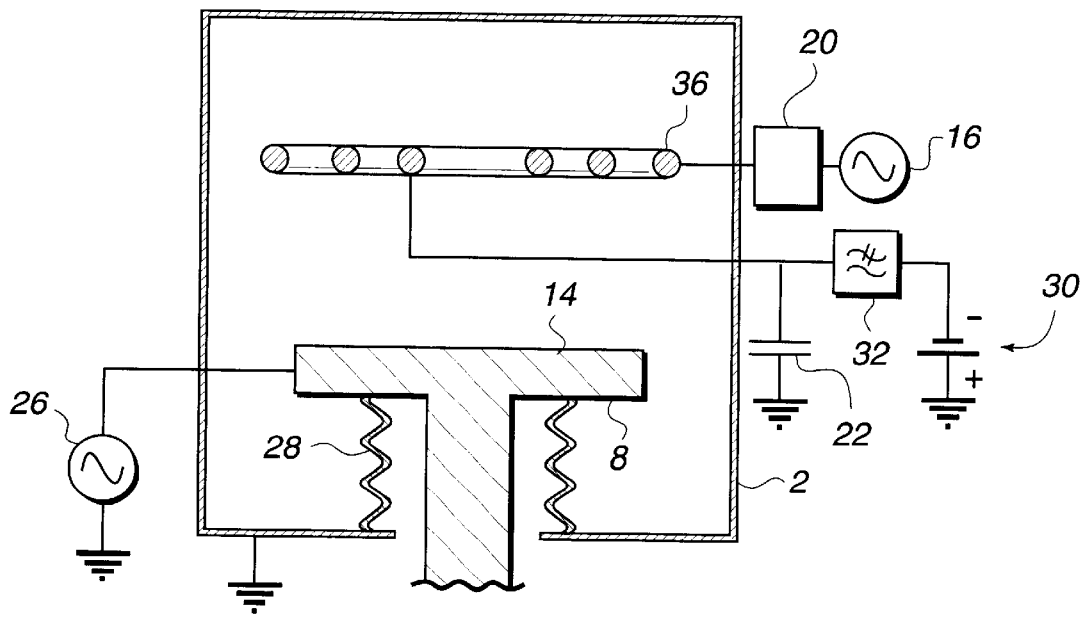
FIG. 3 is a view similar to that of FIG. 1 showing another embodiment of deposition apparatus according to the invention.

The coil configuration shown in FIG. 3 thus represents one of many possibilities made available by the present invention.

Figure 4:
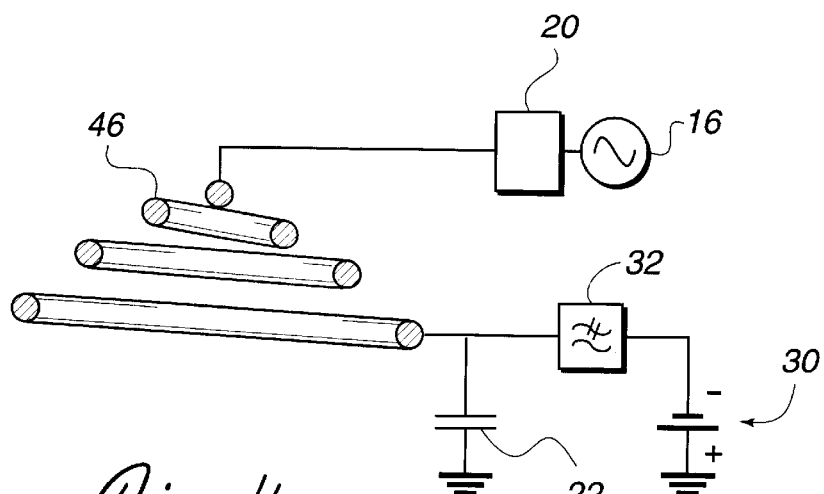
FIG. 4 is a cross-sectional view of another embodiment of a coil which may be employed in apparatus according to the present invention.

Another preferred form of construction for a coil which could serve as a sole source of sputtered material according to one aspect of the invention is coil 46 shown in FIG. 4 and is wound to conform to a dome shape. In certain apparatus configurations, this shape could be found to result in a deposited layer having a particularly high uniformity. FIG. 4 illustrates a non-inverted dome shape. It is anticipated that dome shapes which are inverted may be utilized as well.

Embodiments of the present invention which utilize a coil as the sole source of sputtering material should be expected to deliver such material to the workpiece at a lower rate than would occur if another target were also provided. However, in many cases, the layer which is to be deposited may be very thin and a lower sputtering and deposition rate would allow the thickness of such a layer to be more accurately controlled. Thus, for certain purposes, apparatus exhibiting a lower sputtering and deposition rate is desirable.

On the other hand, when material is to be sputtered and deposited at a high rate, apparatus according to the invention which combines a separate target with a coil which is separately DC biased may be preferred. Because the deposition nonuniformity from target 4 alone may be aggravated at higher deposition rates in some applications, more coil sputtering may be needed to maintain good overall deposition uniformity. Therefore, additional DC bias on the coil will be advantageous in such applications.

Apparatus according to the invention can be employed for depositing metal layers, such as layers of titanium, tantalum, aluminum, etc., in which case the gas introduced to generate a plasma may be selected to not react with ions of the metal to be deposited. A typical gas employed for this purpose is argon.

The invention can also be employed for forming layers of metal compounds, such as TiN, TaN, etc. In this case, the coil, and target, if provided, would be made of the metal component of such a compound, while the gas introduced into chamber 2 would be composed of or consist of another component, such as nitrogen.

In general, embodiments of the invention will be operated to give the bias potential on the coil a magnitude which is greater than its DC self bias potential. A bias potential of greater magnitude will cause material to be sputtered from the coil at a higher rate. Furthermore, when a coil is employed as the sole source of sputtering material, material may be sputtered from the coil at a rate required by certain deposition operations even if the only DC bias on the coil is the self bias. Therefore, according to certain embodiments of the invention in which the coil is the sole source of sputtering material, voltage source 30 and blocking filter 32 are removed, so that the coil end which is remote from RF power supply 16 is connected only to capacitor 22.

The parameters of the RF current supplied to a coil, the component values for the circuitry shown in FIG. 2, the temperature and pressure conditions within chamber 2 and all other operating parameters not specified herein would be selected according to principles known in the art.

Similarly, the precise shape and dimensions of each plasma generating coil can be determined on the basis of principles known in the art. To cite one specific example, in apparatus according to the invention for depositing a layer on a workpiece in the form of a silicon wafer having a diameter of 8 inches, the coil could be constructed in the manner described in copending application Ser. No. 08/857,719, filed May 16, 1997, now U.S. Pat. No. 6,077,402 and entitled "Central Spiral Coil Design for Ionized Metal Plasma Deposition". The plasma generating coils shown in the drawings of the present application are constructed from stock having a circular cross section. However, coils employed in embodiments of the present invention can also be made from stock having other cross-sectional shapes, including square, rectangular, flat ribbon, oval, etc. cross-sectional shapes. For those embodiments in which DC voltage source 30 is employed to increase the magnitude of the DC bias on the coil, i.e. to make that bias more negative, the coil is preferably provided with a cooling fluid channel and a cooling fluid, most commonly water, is caused to flow through the channel for cooling purposes.

Apparatus of the type described above may be employed to form an elemental metal or metal alloy layer or a layer of other types of target material in which formation of a compound which includes the target material is not desired. In this case, the gas filling chamber 2 will preferably be a non-reactive gas, such as argon, helium, xenon, etc. If a metal reaction compound layer is to be deposited in such apparatus, chamber 2 may be filled through port 15 with an appropriate reactive gas which is ionized in the plasma and then combines with ions and atoms of the sputtered metal to form the compound. Typical metal compounds which are formed in this manner include TiN, TaN and $Al_2O_3$. In each case, the target will be made of the metal component or metal alloy component of such compound. When the compound is a nitride, the gas introduced into chamber 2 will contain nitrogen. When the compound is an oxide, the gas introduced into chamber 2 will contain oxygen.

When the illustrated apparatus is operated to form a metal reaction compound layer on a workpiece surface, molecules of the metal compound will typically also be deposited on target 4, as well as on coil 6. If these molecules can be removed from target 4 in a sufficiently short time, then the apparatus can be utilized to deposit a layer of just the target material which is typically a metal or metal alloy. In addition, if, during a deposition of a metal layer, material will be sputtered from coil 6, then metal reaction compound molecules which may have been deposited on coil 6 during the metal compound layer deposition operation should also be removed.

According to the present invention, the apparatus may be placed in a condition to permit deposition of a high purity elemental metal layer or other target material in a short period of time after completion of deposition of a reaction compound layer comprising the elemental metal or other target material as a constituent, by removing all reactive gas from the interior of chamber 2 through an exhaust port such as port 15 and replacing the gas with a suitable non-reactive gas and then creating conditions necessary to sputter the metal reaction compound material off of the target and the coil. In the example described below, the target 4 and coil are made of a high purity elemental metal such as titanium. However, in alternative embodiments, the target and the coil may be made of a variety of target materials including metal alloys and semiconductor materials as described above.

The non-reactive gas may be of any of the types described above, and, more generally, may be of any type which does not include a chemical element that will react with ions of the metal contained in target 4, and possibly in coil 6. In addition, any substrate which has been processed in chamber 2 is preferably removed and work piece support 8 may be covered with a disk, or shutter, 34 of a suitable material, such as a metal, in order to prevent deposition of unwanted material on the upper surface of support 8.

Then, an RF voltage is applied to coil 6 in order to generate an inductively coupled plasma which will cooperate with the magnetic field produced by assembly 10 and the bias voltage on target 4 to sputter metal reaction compound molecules off target 4. At the same time, most or all of the metal reaction compound molecules which have been deposited on coil 6 may be sputtered off. The sputtered metal reaction compound material may be deposited on the walls of chamber 2, where they will not interfere with the subsequent operation of depositing an elemental layer. In addition, a flow of non-reactive gas may be established through port 15 of the chamber 2 in order to carry off some or most of the metal reaction compound molecules, or ions thereof.

In accordance with preferred embodiments of the invention, the cleaning operation will be accelerated by increasing the RF power provided by supply 16 above that supplied during a deposition operation. The power can be increased to any arbitrarily high level, the only requirement being that the power level be maintained below a value which would damage or destroy any component within the chamber, such as coil 6.

A typical RF power level for sputtering a Ti coil is 2.5 kW. This may be doubled to 5 kW or more, for example, during coil cleaning.

In accordance with a further feature of the invention, the sputtering of metal reaction compound molecules from target 4 may be accelerated by increasing the power level of the negative bias applied to target 4 by voltage source 24. Because a film is not being formed on a production substrate during the cleaning operation, limitations which may normally be present on the target power level are not present during this cleaning operation. Accordingly, the DC power level applied to the target 4 may be substantially increased over the value normally used during sputter deposition onto the workpiece. As a consequence, the sputtering rate may be substantially increased to reduce the time needed to clean the target. Again, the power level should not be raised to a level which could damage chamber components. For example, a typical power level for a Ti target is 4 kW. This power level may be raised to 8 to 20 kW or more to clean the target. If the target becomes cleaned before the coil is completely cleaned, the target power level may be reduced to levels just high enough to sputter off any materials being deposited on the target while the coil continues to be sputtered, preferably at higher level, to clean the coil further.

In accordance with preferred embodiments of the invention, the sputtering of metal compound molecules from coil 6 and hence the cleaning of coil 6 is accelerated by increasing the DC bias on coil 6 in the manner described above.

The DC bias imposed on coil 6 by voltage source 30 can have any arbitrarily high value, subject only to the condition that this bias not be so high as to cause damage or destruction to any component within chamber 2. By way of example, in an apparatus in which the self bias on coil 6 would be of the order of −100V during a deposition operation, it is preferred that the DC bias imposed on coil 6 by voltage source 30 have a magnitude greater than −200V in order to assure that the cleaning operation will be performed in a sufficiently short period of time. Also, the power level may be doubled or more, for example, during cleaning.

In accordance with a further preferred embodiment of the invention, the sputtering of metal reaction compound molecules from target 4, and possibly also from coil 6, can be effected by both increasing the RF voltage from power supply 16 and providing a DC bias voltage from source 30, each voltage being produced in the manner described above.

Conceivably, cleaning could be performed, in the presence of a suitably non-reactive gas, by applying to coil 6 only RF power at the same level employed during a deposition operation. However, the time required to perform the cleaning operation would then be comparatively long. Therefore, a cleaning operation of this type would not provide the full benefits offered by the present invention.

According to alternative embodiments of the invention, voltage source 30 can be connected, via filter 32, to other points in the circuit shown in FIG. 2. For example, instead of connecting the coil of filter 32 to the high voltage side of capacitor 22, this end of the coil could be connected to either end of the coil which forms a component of matching network 20.

RF power supply 16 may be constructed to produce an adjustable voltage, as shown in FIGS. 1 and 2. Thus, during cleaning the RF voltage may be substantially increased to minimize cleaning time. Following cleaning, the RF voltage may be substantially reduced to the normal value used for sputtering a film onto a workpiece. When DC voltage source 30 is provided to create, or contribute to, the increased DC bias, or cleaning voltage, on coil 6, source 30 is preferably connected to filter 32 via a switch, as shown in FIGS. 1 and 2. This switch may, alternatively, be connected to the end of the coil of filter 32 which is remote from source 30.

In all of the disclosed embodiments of the invention for cleaning a target and/or coil, any combination of increased RF power and increased DC bias on the coil can be utilized, so long as the destruction of, or damage to, any component of the apparatus is avoided. The component values for the circuitry shown in FIG. 2, the temperature and pressure conditions within chamber 2 and all other operating parameters not specified herein would be selected according to principles known in the art.

Similarly, the precise shape and dimensions of each plasma generating coil can be determined on the basis of principles known in the art. To cite one specific example, in apparatus according to the invention for depositing a layer on a workpiece in the form of a silicon wafer having a diameter of 8 inches, the coil could be constructed in the manner described in copending application Ser. No. 08/857,719, filed May 16, 1997, and entitled "Central Spiral Coil Design for Ionized Metal Plasma Deposition". The plasma generating coils shown in the drawings of the present application are constructed from stock having a circular cross section. However, coils employed in embodiments of the present invention can also be made from stock having other cross-sectional shapes, including square, rectangular, flat ribbon, oval, etc. cross-sectional shapes. Since, according to the present invention, a DC voltage source is employed to increase the magnitude of the DC bias on the coil, i.e. to make that bias more negative, the coil is preferably provided with a cooling fluid channel and a cooling fluid, most commonly water, is caused to flow through the channel for cooling purposes.

The operations of the chamber 2 are preferably controlled by a programmable controller 50 (FIG. 1) such as a microprocessor based workstation. Thus, the switching on and off of the power supplies and generators, the opening and closing of the ports 15, the operation of the magnetron 10 and other functions of the chamber 2 may be controlled automatically by the controller 50.

While particular embodiments of the present invention have been shown and described, it will be apparent to those skilled in the art that changes and modifications may be made without departing from this invention in its broader aspects and, therefore, the aim in the appended claims is to cover all such changes and modifications as fall within the true spirit and scope of this invention.

What is claimed is:

1. Apparatus for depositing a layer of material on a workpiece surface, said apparatus comprising:
   a deposition chamber;
   a workpiece support providing a workpiece support surface for a workpiece within said chamber, the workpiece support surface having a central region and a peripheral region surrounding the central region;
   a coil within said chamber, said coil containing the material to be deposited and being adapted to deposit material sputtered from the coil preferentially to the peripheral region of the workpiece support surface;
   an RF power supply adapted to be coupled to said coil to deliver RF power to said coil to generate a plasma within said chamber, a DC self bias potential being induced in said coil when RF power is delivered to said coil;
   a sputtering target containing the material to be deposited; and
   a DC power supply adapted to be coupled to said coil to provide in said coil a second DC bias potential which is different in magnitude from the DC self bias potential.

2. The apparatus according to claim 1 wherein material is sputtered from said coil when RF power is delivered to said coil, the plasma is generated in said chamber and the second DC bias potential is provided in said coil.

3. The apparatus according to claim 2 wherein the magnitude of the second DC bias potential increases sputtering of material from said coil as compared to said DC self bias potential.

4. The apparatus according to claim 3 wherein said coil is a single turn coil.

5. The apparatus according to claim 4 wherein:
   said target is adapted to deposit material sputtered from said target preferentially on the central region of the workpiece support surface.

6. The apparatus according to claim 3 wherein said DC power supply is a DC voltage source.

7. The apparatus according to claim 6 further comprising an RF power blocking filter connected between said RF power supply and said DC voltage source.

8. The apparatus according to claim 6 wherein the DC bias potential provided by said DC voltage source is greater in magnitude than the DC self bias potential.

9. The apparatus according to claim 1 wherein said coil is a planar coil lying in a plane substantially parallel to the workpiece support surface.

10. The apparatus of claim 1 wherein the output of said second supply to said coil is adjustable so that said second DC bias potential is adjustable as a function of said second supply output.

11. The apparatus of claim 1 further comprising a blocking capacitor coupling said coil to ground so that said second DC bias potential is applied across said blocking capacitor.

12. Apparatus for depositing a layer of a metal-containing material on a workpiece surface, said apparatus comprising:
   a deposition chamber;
   a workpiece support providing a workpiece support surface for a workpiece within said chamber, the workpiece support surface having a central region and a peripheral region surrounding the central region;
   a coil within said chamber, said coil containing the metal of the metal-containing material to be deposited and being adapted to deposit material sputtered from the coil preferentially to the peripheral region of the workpiece support surface;
   means for delivering RF energy to said coil to generate a plasma within said chamber while a DC self bias potential is induced in said coil when RF energy is delivered to said coil;
   a sputtering target containing the metal of the metal-containing material to be deposited and disposed in said deposition chamber so that metal sputtered from said target is deposited preferentially on the portion of said workpiece supported by said central region of said workpiece support surface; and
   means for delivering DC energy to said coil to provide a DC bias potential to said coil, the provided DC bias potential being different in magnitude from the DC self bias potential.

13. The apparatus according to claim 12 wherein the DC bias potential provided by said providing means is greater in magnitude than the DC self potential.

14. Apparatus for depositing a layer of a metal-containing material on a workpiece surface, said apparatus comprising:
   a deposition chamber;
   a workpiece support providing a workpiece support surface for supporting a workpiece within said chamber, said workpiece having a central region and a peripheral region surrounding said central region;
   coil means within said chamber, for sputtering metal from said coil means primarily onto said peripheral region of said workpiece;
   means for delivering RF energy to said coil means to generate a plasma within said chamber and to induce a DC self bias potential in said coil means in response to said delivered RF energy;
   target means disposed in said deposition chamber, for sputtering metal from said target primarily onto said central region of said workpiece; and
   means for delivering adjustable DC energy to said coil to provide an adjustable DC bias potential to said coil, the DC provided bias potential being different in magnitude from the DC self bias potential.

15. The apparatus according to claim 14 wherein said coil means includes a planar coil in a plane substantially parallel to the workpiece support surface.

16. Apparatus for depositing a layer of a metal-containing material on a workpiece surface, said apparatus comprising:
   a deposition chamber;
   a workpiece support providing a workpiece support surface for supporting a workpiece within said chamber, the workpiece support surface having a central region and a peripheral region surrounding the central region;
   a coil within said chamber, said coil containing the metal of the metal-containing material to be deposited and being adapted to deposit material sputtered from the coil preferentially to that portion of the workpiece supported by the peripheral region of the workpiece support surface;
   a blocking capacitor coupling said coil to ground;
   an RF power supply adapted to be coupled to said coil to deliver RF power to said coil to generate a plasma within said chamber while a DC self bias potential is induced in said coil across said blocking capacitor;
   a sputtering target disposed in said deposition chamber so that metal sputtered from said target is deposited preferentially on that portion of said workpiece supported by said central region of the workpiece support surface;
   an adjustable DC voltage source coupled to said coil to provide in said coil a controllable second DC bias potential across said blocking capacitor which is different in magnitude from the DC self bias potential to cause metal to be sputtered from said coil and deposited on said workpiece at a rate which is a function of said controllable DC bias potential; and
   an RF blocking filter coupled between said RF power supply and said adjustable DC voltage source.

17. The apparatus according to claim 16 wherein said coil is a planar coil lying in a plane substantially parallel to the workpiece support surface.

18. A method of depositing a layer of a material on a workpiece surface in a deposition chamber, said method comprising:
   disposing a workpiece having a surface in the chamber, the workpiece surface having a central region and a peripheral region surrounding the central region;
   delivering RF energy to a coil containing the material to be deposited and being adapted to deposit material sputtered from the coil preferentially to the peripheral region of the workpiece surface, wherein a plasma is generated in the chamber and a DC self bias is induced in the coil;
   delivering DC energy to said coil to provide a DC bias potential in the coil to sputter metal from said coil preferentially to the peripheral region of the workpiece surface, said DC provided bias potential being different in magnitude from the DC self bias potential; and
   sputtering material from a target disposed in said deposition chamber onto said workpiece.

19. The method according to claim 18 wherein the plasma and the provided DC bias potential cause the material to be sputtered from the coil at a rate which varies directly with the magnitude of the provided DC bias potential, and further comprising adjusting the magnitude of the DC bias potential to sputter material from said coil at a selected rate.

20. The method according to claim 18 wherein:
   said sputtering of material from said target within the chamber is carried out to deposit sputtered material from the target preferentially in a layer on the central region.

21. The method according to claim 20 wherein said adjusting the magnitude of the DC bias potential is controlled to minimize differences between the thickness of the layer in the peripheral region and the thickness of the layer in the central region.

22. The method according to claim 18 wherein the coil is configured to surround the workpiece surface.

23. The method according to claim 18 wherein the DC bias potential provided in the coil is greater in magnitude than the DC self bias potential.

24. A method of depositing a layer of a metal-containing material on a workpiece surface in a deposition chamber, said method comprising:

disposing a workpiece having a surface in the chamber, said workpiece surface having a central region and a peripheral region surrounding said central region;

disposing a coil and a target within the chamber, the coil and the target each containing the metal of the metal-containing material, said coil being disposed to sputter metal preferentially onto said workpiece surface peripheral region and said target being disposed to sputter metal preferentially onto said workpiece surface central region;

delivering RF energy to the coil to generate a plasma within the chamber and to induce a DC self bias potential in the coil in response to said RF energy;

delivering DC energy to said coil to set a DC bias potential in the coil to cause metal to be sputtered preferentially from said coil to said workpiece surface peripheral region at a rate which is a function of said set DC bias potential, which set DC bias potential is different in magnitude from the DC self bias potential; and sputtering the target to deposit metal from the target preferentially onto the workpiece surface central region.

25. The method according to claim 24 wherein the coil is a planar coil lying in a plane substantially parallel to the workpiece support surface.

26. A method of depositing a layer of a metal-containing material on a workpiece surface in a deposition chamber, said method comprising:

disposing a workpiece having a surface in the chamber, said workpiece surface having a central region and a peripheral region surrounding said central region;

sputtering metal from a target disposed in said deposition chamber so that said metal from said target is sputtered preferentially onto said workpiece surface central region;

disposing a coil within the chamber, the coil containing the metal of the metal-containing material and having a blocking capacitor coupled to the coil, said coil being disposed so that said metal from said coil is sputtered preferentially onto said workpiece surface central region;

generating a plasma in the chamber by delivering RF power from an RF power supply to the coil wherein a DC self bias potential is induced in the coil when RF power is delivered thereto;

providing a DC bias potential in the coil using a DC voltage supply to sputter metal from the coil preferentially to the workpiece surface peripheral region; and filtering said RF power from said DC voltage supply.

27. The method according to claim 26 wherein the coil comprises a plurality of turns.

28. The method according to claim 27 wherein the coil turns have respectively different diameters.

29. A method of depositing a layer on a substrate surface having a central region and a peripheral region surrounding said central region, comprising:

delivering RF energy to a coil containing a material to be deposited, wherein a plasma is generated in the chamber and a DC self bias is induced in the coil;

sputtering a first time a material from a target disposed in said deposition chamber preferentially onto said workpiece surface central region;

delivering DC energy to said coil to provide a DC bias potential in the coil to sputter a material from said coil a first time, said DC provided bias potential being different in magnitude from the DC self bias potential to bias said coil at a first biasing level to provide a first sputtering rate of said coil to deposit a layer of a reaction compound preferentially on said substrate surface peripheral region in a chamber, said reaction compound comprising a material sputtered from said coil;

sputtering said coil and target a second time while biasing said coil at a second biasing level, to provide a second sputtering rate higher than the first sputtering rate, to remove a coating of reaction compound from said coil; and after said reaction compound coating removal sputtering, sputtering said target and coil a third time to deposit a layer of coil material substantially free of said reaction compound on a substrate in said chamber.

30. The method of claim 29 wherein said sputtering a first time a material from a target comprises biasing said target at a first level to provide a first sputtering rate of said target, and said reaction compound coating removal sputtering comprises biasing said target at a second level, higher than said first biasing level, to provide a second sputtering rate, higher than said first sputtering rate so that said reaction compound coating removal sputtering is at a higher rate than said sputtering a first time a material from a target.

31. The method of claim 29 wherein said biasing of said coil at a second biasing level includes coupling a DC voltage source to said coil.

32. The method of claim 29 further comprising removing said substrate having said reaction compound layer prior to said reaction compound coating removal sputtering and covering a substrate support during said reaction compound coating removal sputtering.

33. An apparatus for depositing a layer on a substrate surface having a central region and a peripheral region surrounding said central region, comprising:

a chamber having sputter material sources which include a target and an RF coil, a biasing DC power supply for applying a DC biasing voltage to said RF coil, a support for a substrate positioned to receive material sputtered from said sputter material sources onto said substrate wherein said coil and said support are positioned so that material sputtered from the coil is deposited preferentially on the peripheral region of the substrate surface, and at least one port for admitting a reactive material other than said sputter source material and for expelling said reactive material; and a programmable chamber controller, said controller being programmed to cause said chamber to 1) admit reactive material; 2) sputter said sputter material sources to deposit a layer of a reaction compound on said substrate, said reaction compound comprising said source material sputtered from said sputter material sources and said reactive material; 3) expel reactive material from said chamber; 4) sputter said sputter material sources a second time to remove a coating of reaction compound from said sputter material sources; and 5) after said reaction compound removal sputtering, sputter said sputter material sources a third time to deposit a layer of sputter source material substantially free of said reaction compound on a substrate in said chamber, wherein said controller is further programmed to control said biasing DC power supply to 1) bias said coil at a first level to provide a first sputtering rate of said coil during depositing of said layer of reaction compound; and 2) bias said coil at a second level, different from said first biasing level, to provide a second sputtering rate during said reaction compound coating removal sputtering, higher than said first sputtering rate.

34. The apparatus of claim 33 wherein said biasing DC power supply is a DC voltage source coupled to said coil.

35. Apparatus for selectively depositing, on a surface of a substrate having a central region and a peripheral region surrounding the central region, either a layer consisting essentially of a metal, in an atmosphere consisting essentially of non-reactive gas, or a layer of a reaction compound of the metal, in an atmosphere containing a reactive gas, said apparatus comprising:

a closed deposition chamber for containing the substrate and the atmosphere;

a target disposed in said chamber;

a metal coil disposed in said chamber and being positioned to deposit material sputtered from the coil preferentially to the peripheral region of the workpiece surface; and power supply means connected to said coil for applying to said coil energy for creating, within said chamber, an inductively coupled plasma which acts to sputter metal from said coil within said deposition chamber and to ionize the sputtered metal for deposition on the substrate surface, wherein said power supply means are controllable for applying a voltage having a first magnitude to said coil during deposition of a layer of a reaction compound of the metal and for applying a voltage having a second magnitude, larger than the first magnitude, after deposition of a layer of a reaction compound of the metal and before deposition of a layer consisting essentially of the metal, and while the atmosphere within said chamber consists essentially of the non-reactive gas, and further wherein said power supply means comprise a DC power supply for selectively applying a DC bias to said coil to create at least a portion of the voltage having the second magnitude.

36. The apparatus according to claim 35 wherein said power supply means further comprise an RF power source for controllably supplying either a first RF power level to said coil, to create the voltage having the first magnitude, or a second RF power level which is higher than the first RF power level to create a portion of the voltage having the second magnitude.

37. The apparatus according to claim 35 wherein said power supply means further comprise an RF power source for supplying RF power to said coil to create the voltage having the first magnitude.

38. The apparatus according to claim 35 further comprising:

a substrate support within said chamber, said substrate support having a support surface on which a substrate rests during deposition of a layer; and a cover plate for covering the support surface when the voltage having the second magnitude is being applied to said coil.

* * * * *